(12) United States Patent
Uemichi (10) Patent No.: US 9,814,131 B2
(45) Date of Patent: Nov. 7, 2017

(54) INTERCONNECTION SUBSTRATE

(71) Applicant: FUJIKURA LTD., Koto-ku, Tokyo (JP)

(72) Inventor: Yusuke Uemichi, Sakura (JP)

(73) Assignee: FUJIKURA LTD., Koto-ku, Tokyo (JP)

( * ) Notice: Subject to any disclaimer, the term of this patent is extended or adjusted under 35 U.S.C. 154(b) by 140 days.

(21) Appl. No.: 14/584,471

(22) Filed: Dec. 29, 2014

(65) Prior Publication Data

US 2015/0107888 A1  Apr. 23, 2015

Related U.S. Application Data

(63) Continuation of application No. PCT/JP2013/073665, filed on Sep. 3, 2013.

(30) Foreign Application Priority Data

Sep. 7, 2012  (JP) .................................. 2012-197388

(51) Int. Cl.
*H01B 17/16* (2006.01)
*H05K 1/02* (2006.01)
(Continued)

(52) U.S. Cl.
CPC ....... *H05K 1/0251* (2013.01); *H04L 25/0272* (2013.01); *H05K 1/0216* (2013.01);
(Continued)

(58) Field of Classification Search
CPC ....... H01L 21/486; H01L 23/50; H01L 23/66; H01L 23/49816; H01L 23/49827;
(Continued)

(56) References Cited

U.S. PATENT DOCUMENTS 5,986,893 A * 11/1999 Leigh .................. H05K 1/0219
  174/261
6,211,468 B1 * 4/2001 Windschitl ............ H01L 21/486
  174/254

(Continued)

FOREIGN PATENT DOCUMENTS

JP          2736107 B2     4/1998
JP       2002-359446 A    12/2002
(Continued)

OTHER PUBLICATIONS

Computer Translation of JP 2007142307, which was cited in the IDS filed on Dec. 29, 2014.
(Continued)

*Primary Examiner* — Timothy Thompson
*Assistant Examiner* — Guillermo Egoavil
(74) *Attorney, Agent, or Firm* — Sughrue Mion, PLLC (57) ABSTRACT

An interconnection substrate includes: a substrate having a first surface and a second surface opposite the first surface; and a transmission line including two parallel through-hole interconnections that are exposed to the first and second surfaces and are formed inside the substrate. Also, at least one of the two through-hole interconnections includes a narrow portion having a smaller diameter than a diameter of the through-hole interconnection in the first surface and a diameter of the through-hole interconnection in the second surface.

5 Claims, 8 Drawing Sheets

(51) Int. Cl.
*H04L 25/02* (2006.01)
*H05K 1/11* (2006.01)
*H05K 3/40* (2006.01)
*H05K 3/44* (2006.01)

(52) U.S. Cl.
CPC ........... *H05K 1/0245* (2013.01); *H05K 1/115* (2013.01); *H05K 3/4038* (2013.01); *H05K 3/445* (2013.01); *H05K 2201/09854* (2013.01); *Y10T 29/49165* (2015.01)

(58) Field of Classification Search
CPC ....... H01L 23/49838; H01L 2223/6638; H01L 2224/16; H01L 2924/0002; H01L 2924/3011; H01L 2924/01078; H01L 2924/09701; H01L 2924/15311; H01L 2924/19105; H05K 1/0216; H05K 1/0237; H05K 1/0245; H05K 1/0251; H05K 1/0263; H05K 1/0298; H05K 1/0306; H05K 3/0038; H05K 3/0044; H05K 3/427; H05K 3/429; H05K 3/445; H05K 3/4038; H05K 3/4602; H05K 3/4605; H05K 2201/044; H05K 2201/01; H05K 2201/09236; H05K 2201/09518; H05K 2201/09536; H05K 2201/09563; H05K 2201/09636; H05K 2201/09627; H05K 2201/09809; H05K 2201/09827; H05K 2201/09854; H05K 2201/10189; H05K 2201/10689; H05K 2203/025; H05K 2203/1572; H05K 2203/1581; Y10T 29/49124; Y10T 29/49165
USPC ................. 174/258, 262, 266; 257/E23.079, 257/E23.07; 361/58; 439/14
See application file for complete search history.

(56) References Cited

U.S. PATENT DOCUMENTS

| | | | | |
|---|---|---|---|---|
| 2002/0179332 | A1* | 12/2002 | Uematsu | H05K 1/115 174/262 |
| 2005/0023033 | A1* | 2/2005 | Saiki | H05K 3/305 174/260 |
| 2007/0130555 | A1 | 6/2007 | Osaka | |
| 2007/0195473 | A1* | 8/2007 | Matsumoto | H05K 1/0216 361/58 |
| 2008/0054491 | A1* | 3/2008 | Makino | H01L 23/13 257/784 |
| 2009/0170240 | A1* | 7/2009 | Stearns | H01L 23/49838 438/106 |
| 2010/0307809 | A1* | 12/2010 | Noda | H05K 3/0032 174/266 |
| 2011/0048775 | A1 | 3/2011 | Ishida et al. | |

FOREIGN PATENT DOCUMENTS

| | | |
|---|---|---|
| JP | 2007-142307 A | 6/2007 |
| WO | 2011/024921 A1 | 3/2011 |

OTHER PUBLICATIONS

Computer Translation of JP 2002359446, which was cited in the IDS filed on Dec. 29, 2014.
Communication dated Jan. 6, 2015 from the Japanese Patent Office in counterpart application No. 2014-534363.
International Search Report of PCT/JP2013/073665 dated Dec. 10, 2013.
Communication dated Feb. 8, 2016 from the European Patent Office in counterpart application No. 13835561.5.
Communication dated May 7, 2015, issued by the Japanese Patent Office in counterpart Japanese application No. 2014-534363.

* cited by examiner

Prior Art

FIG. 5B

Prior Art

FIG. 6

Prior Art

Prior Art

FIG. 11B

Prior Art

FIG. 12

Prior Art

FIG. 13

Prior Art

INTERCONNECTION SUBSTRATE

CROSS REFERENCE TO RELATED APPLICATIONS

This application is a continuation application based on a PCT Patent Application No. PCT/JP2013/073665, filed Sep. 3, 2013, whose priority is claimed on Japanese Patent Application No. 2012-197388, filed Sep. 7, 2012, the entire content of which are hereby incorporated by reference.

BACKGROUND OF THE INVENTION

Field of the Invention

The present invention relates to an interconnection substrate, and in particular, to an interconnection substrate that includes a transmission line including through-hole interconnections.

Description of the Related Art

In recent years, there has been demand for high-speed data communication between storages or servers at a data transfer rate of tens of Gbps. In such high-speed transmission technology for digital signals, a differential transmission method is often used.

The differential transmission method is a transmission method for transmitting signals of opposite polarities to two parallel lines. This method has a feature in that resistance to common mode noise is high because a signal is recognized based on the potential difference. The interconnection substrate including differential transmission lines is disclosed in Japanese Patent No. 2736107, for example.

The differential transmission method is advantageous in terms of low power consumption, high resistance to external noise, and less susceptibility to the influence of ground potential. Such a data transmission system is configured to include a signal transmission IC (transmitter), a channel (signal transmission path), and a signal receiving IC (receiver).

The wiring design rule of the terminal spacing of an IC is different from that of the terminal spacing of a channel, such as a printed circuit board. Therefore, an interposer substrate (interposer substrate) is often interposed between the IC and the channel.

Figure 11A:
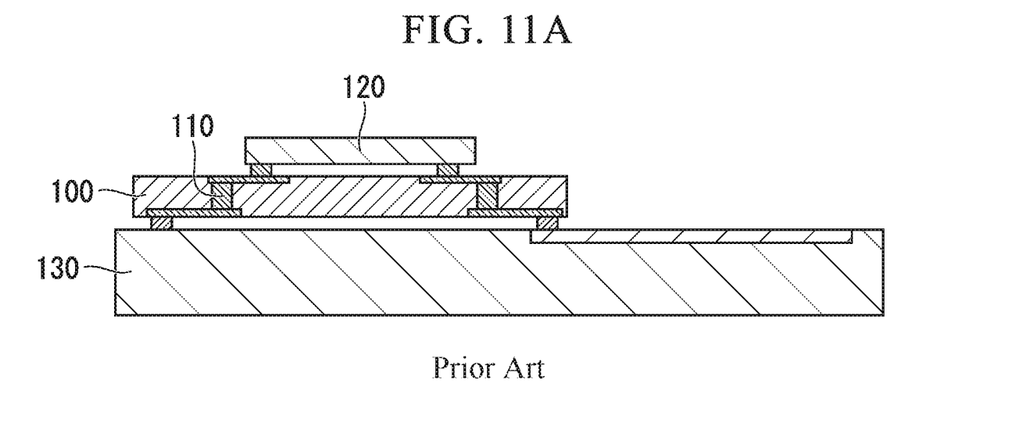
FIG. 11A is a cross-sectional view showing an example of the conventional interposer substrate.
Figure 11B:
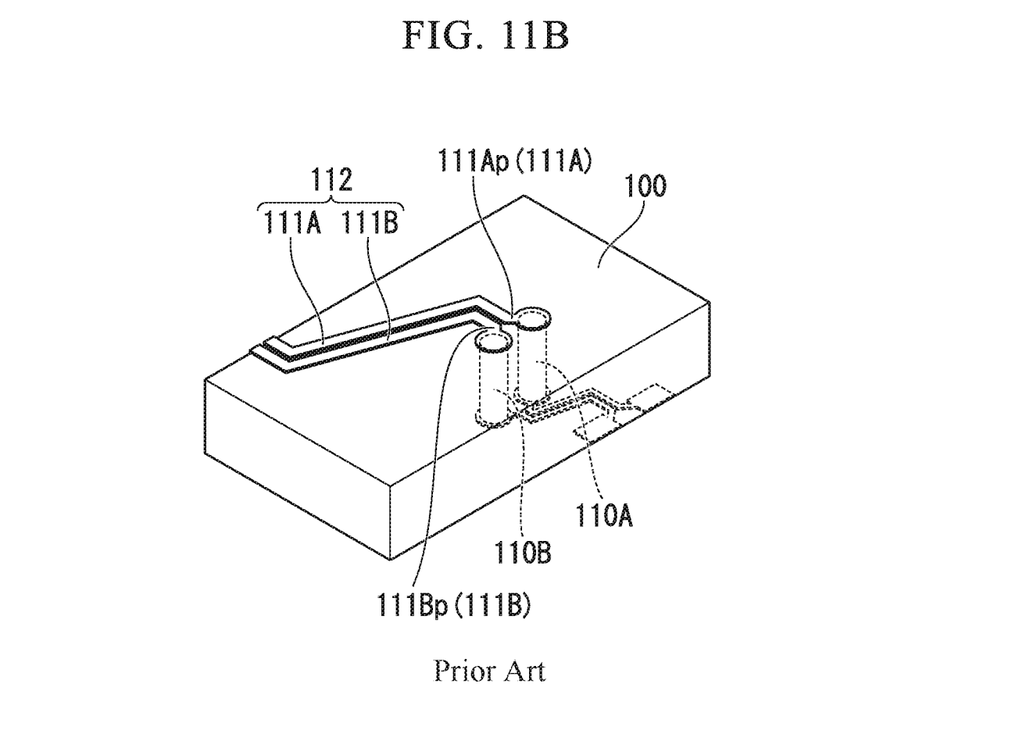
FIG. 11B is a transparent perspective view showing an example of the conventional interposer substrate.

FIGS. 11A and 11B are an example of a conventional interposer substrate 100 including through-hole interconnections through which differential signals flow. A signal emitted from an IC 120 passes through a surface wiring, which is formed on the main surface of the interposer substrate 100, and then passes through a through-hole interconnection 110 inside the interposer substrate and is guided to a printed circuit board 130 through a mounting portion. As described above, the surface wiring and the through-hole interconnection through which differential signals flow are two parallel lines.

Figure 12:
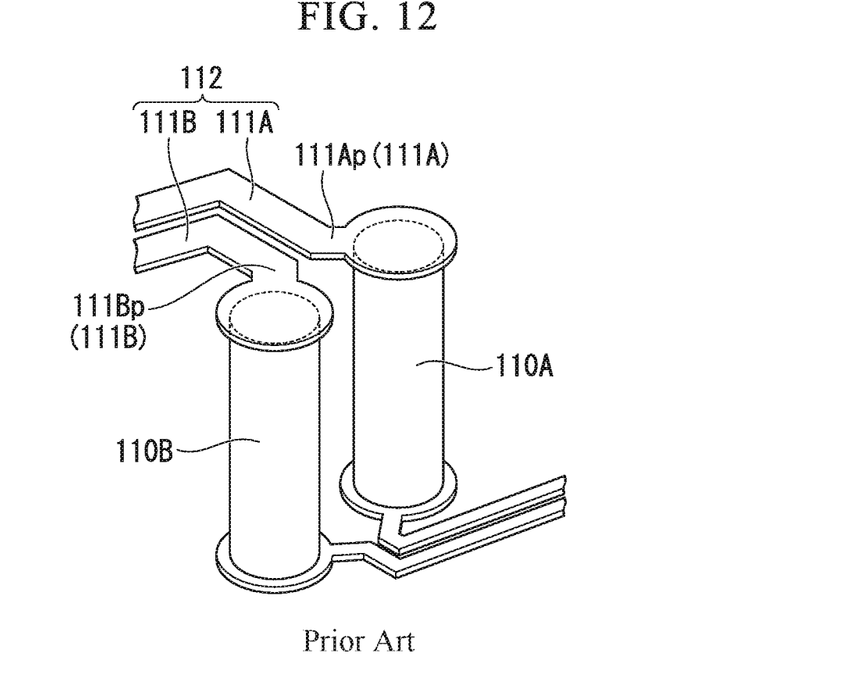
FIG. 12 is a transparent perspective view showing an example of through-hole interconnections based on the conventional differential transmission method.

FIG. 12 shows a conventional transparent perspective view of an interposer substrate including through-hole interconnections through which differential signals flow. If true differential transmission mode signals flow, it can be considered that two through-hole interconnections are coupled by an electric field. In addition, in order to realize excellent transmission characteristics, the differential transmission line is designed to have specific differential impedance (for example, 100 Ω). One of the factors that determine the differential impedance is a separation distance between two parallel through-hole interconnections. Generally, forming through-hole interconnections penetrating through the substrate is technically more difficult than forming surface wirings formed on the substrate surface. Therefore, the through-hole interconnections are thicker than the surface wirings. In addition, with regard to the differential transmission line configured to include the through-hole interconnections, in order to realize target differential impedance, it is necessary to ensure a distance between two parallel through-hole interconnections to some extent. In other words, under restrictions to realize excellent transmission characteristics, it is not possible to narrow the distance between two through-hole interconnections. Therefore, it is necessary to ensure a region occupied by two through-hole interconnections in the substrate to some extent or more. For this reason, there has been a problem in that it is difficult to miniaturize the substrate and to form high-density through-hole interconnections.

The aforementioned conventional problem will be described in more detail using the transmission line theory. A TEM mode is known as a transmission mode of the transmission line, such as a microstrip line or a coaxial line.

Here, the transmission of the TEM wave will be discussed.

Generally, the TEM mode is a high-frequency signal transmission mode between two conductors. For example, one of the two conductors is a signal line and the other conductor is a GND.

In the case of a coaxial cable, the former is the core and the latter is an outer conductor.

In the signal line, inductances of L per unit length [H/m] are distributed in series, and the capacitance of C [F/m] per unit length is formed between two conductors. In addition, series resistance R [Ω/m] due to the resistance of the conductor and parallel conductance G [S/m] that defines the amount of signal leakage between two conductors are distributed in the signal line.

In the process of solving the telegraph equation of the transmission system that is being discussed currently, the characteristic impedance $Z_x$ is defined as the ratio of voltage V and current I at a certain point, and this can be expressed by the relational expression shown below.

$$Z_x = \sqrt{\frac{R + j\omega L}{G + j\omega C}} \qquad \text{[Math. 1]}$$

Here, j is an imaginary unit, and ω is an angular frequency (rad/s) of the AC current.

When the frequency is high and/or the resistance R of the conductor and the dielectric loss G are simply small in this expression, $R \ll \omega L$ and $G \ll \omega C$ are satisfied. Accordingly, the expression is simplified as Math. 2.

$$Z_x = \sqrt{\frac{L}{C}} \qquad \text{[Math. 2]}$$

That is, the characteristic impedance Zx can be defined by the inductance L of the conductor line and the capacitance C between two conductors.

The differential through-hole interconnections will be discussed from the point of view of differential transmission line design. Because of the differential operation of through-hole interconnections, it is easily expected that the through-hole interconnections are in a form of two parallel lines. In addition, since the through-hole interconnections are considered to be the signal transmission mode between two conductors described above, the above discussion can be directly applied.

In a typical printed wiring board, through holes of through-hole interconnections are manufactured by using a processing method, such as drilling or laser machining, and the diameter depends on the processing method. Generally, the diameter of the through hole of each through-hole interconnection is expected to be about 300 μm. The length of each through-hole interconnection is determined by the substrate thickness. In addition, a substrate has a dielectric constant specific to the material.

In differential design, the differential impedance $Z_{diff}$=100 Ω is generally applied in many cases. The differential impedance is the characteristic impedance that has been discussed so far. Accordingly, the impedance is determined by the inductance per unit length and the capacitance per unit length.

According to conventional techniques, it is believed that the inductance of the through-hole interconnection is determined by the diameter of the through hole and the surface area (facing area) of a portion where the through holes face each other and the dielectric constant of the material, which define the capacitance, are also uniquely determined by the substrate technique that is used. Therefore, in order to obtain the target $Z_{diff}$=100 Ω in the differential design, it is thought that there is no other way but to adjust the distance between the through holes.

In general, however, each through hole has a large surface area due to the processing size. For this reason, in order to obtain a relatively high impedance of 100 Ω, the through holes should be separated from each other to some extent. For example, the separation distance between the through holes is about 350 to 400 μm, which is larger than the diameter of each through hole.

In order to obtain the target impedance, this separation distance is uniquely determined by the result of the discussion mentioned so far. Therefore, since the distance between differential through-hole interconnections is determined by the design value of differential impedance, there is a problem in that the distance between the differential through-hole interconnections cannot be changed.

In particular, this means that, when a plurality of differential terminals are disposed, the footprint cannot be reduced, which is contrary to the high-density mounting of recent years.

Figure 13:
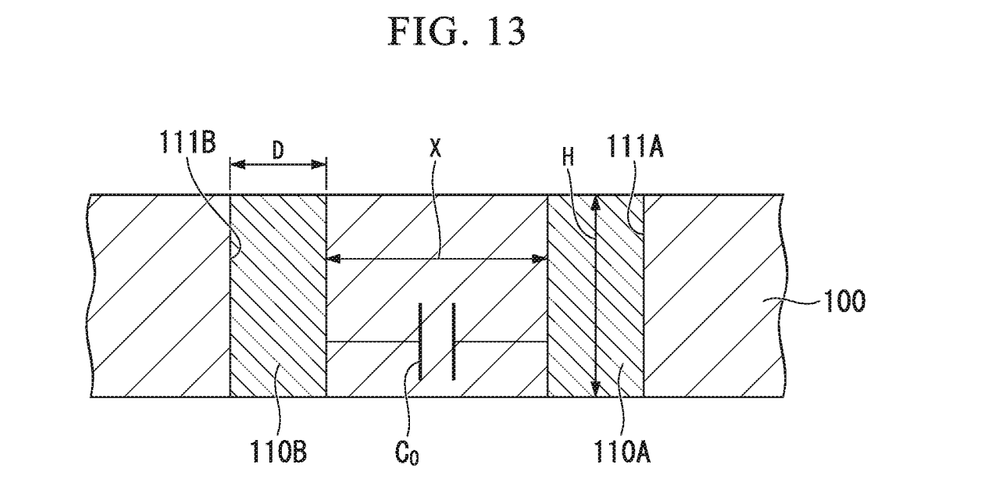
FIG. 13 is a cross-sectional view showing the conventional differential through-hole interconnections.

Here, FIG. 13 is a cross-sectional view showing the conventional differential through-hole interconnections.

As shown in FIG. 13, in the conventional differential through-hole interconnections, when the redundancy of the diameter D and height H of through holes 111A and 111B and dielectric material properties (dielectric constant ∈) is small, a distance X between differential through-hole interconnections can have only one value in order to satisfy the specific differential impedance that is defined by differential transmission line design.

In addition, the apparent inductance per unit length (here, defined as the thickness of a substrate) of the through holes 111A and 111B can be expressed by the diameter D [mm] and the height H [mm] of the through hole as in Math. 3.

$$L = 0.2H\left(2.303\log\frac{4H}{D} - 0.75\right)[nH] \quad [\text{Math. 3}]$$

In addition, the capacitance per unit length C between the through holes 111A and 111B is expressed by Math. 4 when the facing area between the through holes 111A and 111B is defined as S and the dielectric constant of the dielectric filled in the through holes 111A and 111B is defined as 107.

$$C = \varepsilon\frac{S}{X} \quad [\text{Math. 4}]$$

Here, there is only one $C_0$ satisfying the differential impedance $Z_{diff}=\sqrt{L_0/C_0}$=100 Ω. That is, the distance X between through holes cannot be changed.

That is, in the conventional differential through-hole interconnections, the distance X between the differential through-hole interconnections 110A and 110B is large. For this reason, there has been a problem in that the footprint is increased.

The present invention has been made in view of such circumstances of the related art, and it is an object of the present invention to provide an interconnection substrate in which the distance between a pair of through-hole interconnections can be reduced and accordingly transmission lines disposed at a high density can be realized while suppressing the degradation of transmission characteristics.

SUMMARY

An interconnection substrate according to a first aspect of the present invention includes: a substrate having a first surface and a second surface opposite the first surface; and a transmission line including two parallel through-hole interconnections that are exposed to the first and second surfaces and are formed inside the substrate. At least one of the two through-hole interconnections includes a narrow portion having a smaller diameter than a diameter of the through-hole interconnection in the first surface and a diameter of the through-hole interconnection in the second surface.

Each of the two through-hole interconnections may have the narrow portion, and the narrow portions of the two through-hole interconnections may be disposed at the same distance from the first surface.

In the narrow portion, a portion having a smallest diameter may be provided at a center of the substrate in a thickness direction of the substrate.

Shapes of the two through-hole interconnections on a cross-section parallel to the first surface may be the same throughout an entire thickness of the substrate.

The substrate may be an monolithic structure.

The transmission line may include two surface wirings disposed in parallel on the first surface of the interconnection substrate, and the two surface wirings may be connected to respective the two through-hole interconnections through a pitch adjusting portion configured to adjust each wiring pitch.

An interconnection substrate manufacturing method according to a second aspect of the present invention includes: preparing a substrate having a first surface and a second surface opposite the first surface; disposing a resist in a portion excluding a portion for forming a through hole on both the first and second surfaces; and forming a through hole, which has a narrow portion having a smaller diameter than a diameter of the through-hole interconnection in the first surface and a diameter of the through-hole interconnection in the second surface, inside the substrate by performing sandblasting through the resist on both the first and second surfaces.

In the interconnection substrate according to the aspects of the present invention, at least one of the two through-hole interconnections that form a differential transmission line includes a narrow portion where the separation distance between the two through-hole interconnections is locally increased.

Since at least one of the two through-hole interconnections includes a narrow portion, it is possible to achieve the same effect that the distance between the conventional straight-shaped through-hole interconnections is increased. That is, in the conventional straight-shaped through-hole interconnections, assuming that the distance between through holes to satisfy the predetermined impedance conditions is X and the distance between through-hole interconnections including narrow portions is Y, the relationship of Y<X is necessarily satisfied.

As the basic principle, when the distance between the through-hole interconnections including narrow portions is the same as the distance between the conventional straight-shaped through-hole interconnections, the relationship of $C_0 > C_1$ is satisfied assuming that the capacitive component for the former case is $C_0$ (F) and the capacitive component for the latter case is $C_1$ (F). By narrowing the distance between the through-hole interconnections including the narrow portions, a capacitive component corresponding to the deficit is increased. As a result, it is possible to narrow the distance between the through holes.

As a result, in the present invention, since it is possible to reduce the distance between the two through-hole interconnections through which differential signals flow, it is possible to realize an interconnection substrate including transmission lines disposed at a high density while suppressing the degradation of transmission characteristics.

DETAILED DESCRIPTION OF THE PREFERRED EMBODIMENTS

Hereinafter, an interconnection substrate according to an embodiment of the present invention will be described with reference to the figures.

Figure 1A:
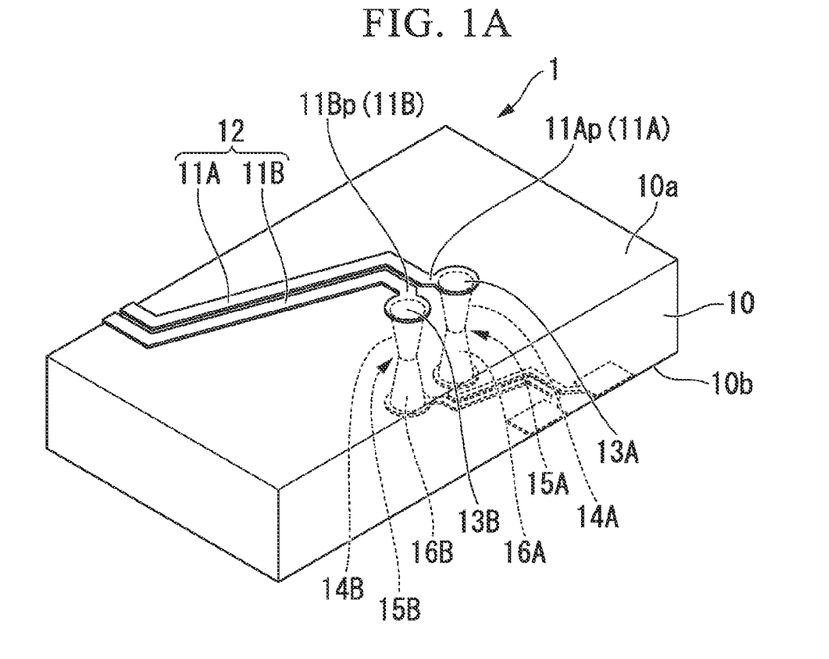
FIG. 1A is a transparent perspective view showing an example of the configuration of an interconnection substrate of the present invention.

FIG. 1A is a transparent perspective view showing a configuration example of an interconnection substrate 1 according to an embodiment of the present invention.

The interconnection substrate 1 according to the embodiment of the present invention includes a transmission line 12 and two through-hole interconnections 16A and 16B on one surface 10a (first surface) of a substrate 10. The transmission line 12 is configured to include two surface wirings 11A and 11B disposed in parallel, and the two through-hole interconnections 16A and 16B are formed by filling or depositing conductors in through holes 14A and 14B formed in the substrate 10 and are electrically connected to the two surface wirings 11A and 11B, respectively.

Although a case where the transmission line 12 is used as a differential transmission line will be referred to in the explanation of the embodiment of the present invention, the transmission line 12 of the present invention is not limited to the differential transmission line. In addition, when the transmission line 12 is used as a differential transmission line, a ground wiring (not shown) may be appropriately provided on the interconnection substrate 1.

The substrate 10 is formed of a material having small dielectric loss in a high-frequency region. Examples of the material of the substrate 10 are fluorine-based resin materials, for example, quartz, borosilicate glass, high insulating silicon, fine ceramics, liquid crystal polymers, Teflon (registered trademark), etc. Fluorine-based materials, such as quartz, liquid crystal polymers, and Teflon, are preferably used as the materials of the substrate 10 since the dielectric constant is especially small. The thickness of the substrate 10 is preferably set so that the interconnection substrate 1 has a predetermined thickness or more and the transportability of a wafer is satisfied. For example, the thickness of the substrate 10 is set to 0.1 to 2.0 mm. In addition, the substrate 10 of the present invention is preferably an monolithic structure.

The transmission line 12 is configured to include the two parallel surface wirings 11A and 11B (surface wirings). The two surface wirings 11A and 11B have positive and negative polarities, respectively, and form a transmission line in pairs.

The surface wirings 11A and 11B are formed of a conductor having low resistance. For example, the surface wirings 11A and 11B are formed by electrolytic plating of Cu. The film thickness, the wiring width, and the distance of the surface wirings 11A (+) and 11B (−) can be designed to have desired characteristic impedance.

Figure 1B:
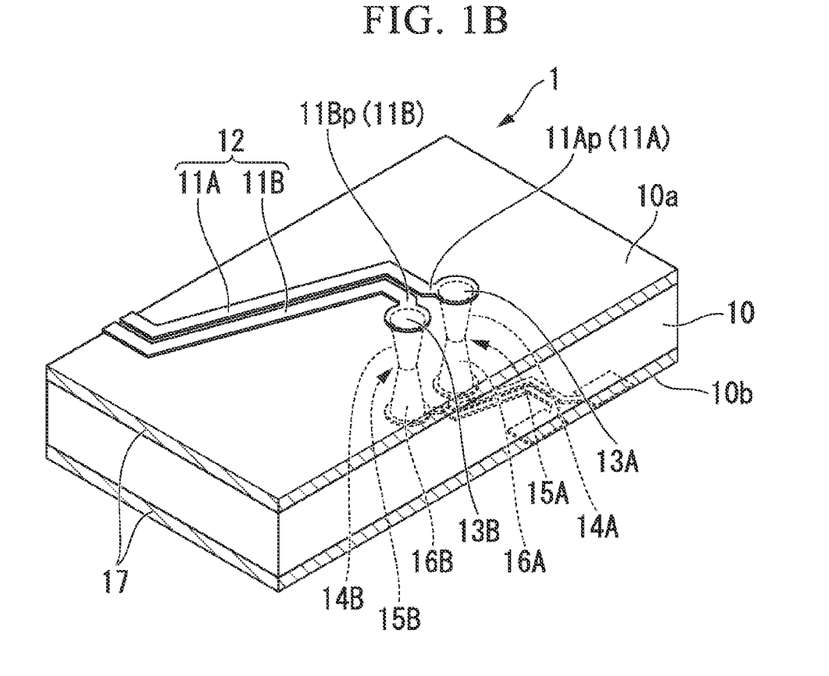
FIG. 1B is a transparent perspective view showing a modification of the interconnection substrate according to an embodiment of the present invention.

As shown in FIG. 1B, in order to reduce the thermal stress on the substrate 10 that occurs when forming the surface wirings, a thermal relaxation resin 17 may be provided on the one surface 10a of the substrate 10, and the surface wirings 11A and 11B may be formed on the thermal relaxation resin 17. As a material of the thermal relaxation resin 17, it is preferable to use polyimide resin or silicon resin having high heat resistance. In FIG. 1B the thermal relaxation resin 17 is also provided on the other surface (second surface) 10b of the substrate 10. However, the thermal relaxation resin 17 may be provided on only one of the surfaces 10a and 10b.

Electrode pads 13A and 13B are electrically connected to the surface wirings 11A and 11B, respectively. The electrode pads 13A and 13B are formed on one surface 10a of the substrate 10, and at least parts of the electrode pads 13A and 13B are provided so as to be exposed to the hole from one opening of the through holes 14A and 14B.

As materials of the electrode pads 13A and 13B, for example, materials having excellent electrical conductivity, such as aluminum (Al), copper (Cu), aluminum silicon (Al—Si) alloy, or aluminum silicon copper (Al—Si—Cu) alloy, are preferably used.

Figure 2:
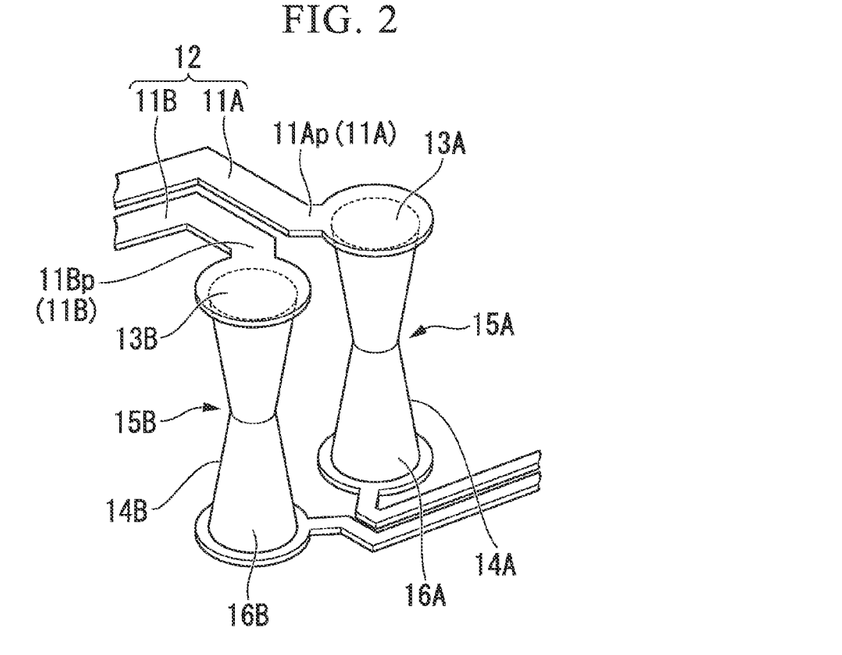
FIG. 2 is an enlarged transparent perspective view of portions of through-hole interconnections in the interconnection substrate shown in FIG. 1.
Figure 3:
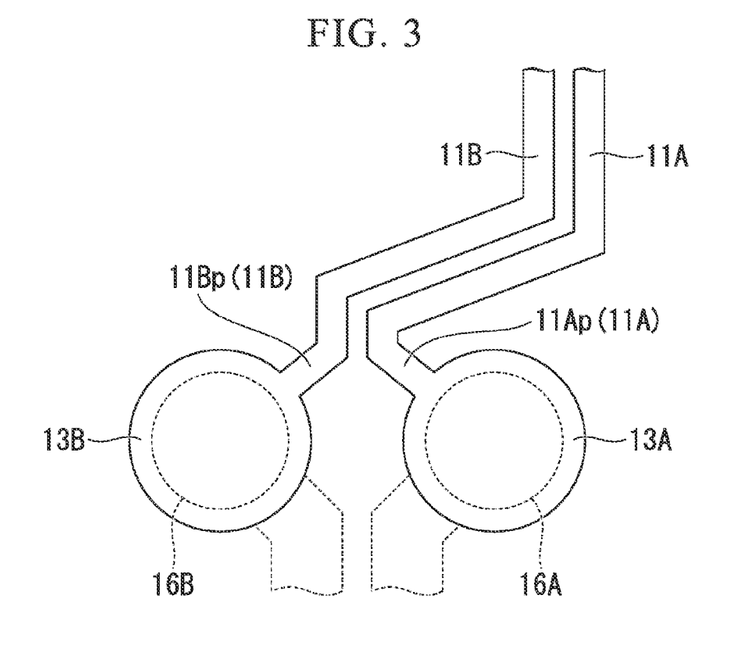
FIG. 3 is an enlarged plan view of portions of through-hole interconnections in the interconnection substrate shown in FIG. 1.

FIG. 2 is an enlarged transparent perspective view of portions of the through-hole interconnections 16A and 16B in the interconnection substrate 1 according to the embodiment of the present invention. FIG. 3 is an enlarged plan view of portions of the through-hole interconnections 16A and 16B in the interconnection substrate 1 according to the embodiment of the present invention.

The through-hole interconnections 16A and 16B are disposed so as to penetrate the substrate 10 from the other surface 10b side to the one surface 10a side of the substrate 10, and the through-hole interconnections 16A and 16B are configured to include through holes 14A and 14B, through which parts of the electrode pads 13A and 13B are exposed, and conductors that are filled or deposited within the through holes 14A and 14B. The through-hole interconnections 16A and 16B are electrically connected to the two surface wirings 11A and 11B, which form the transmission line 12, through the electrode pads 13A and 13B, respectively.

As shown in FIG. 2, in the interconnection substrate 1 according to the embodiment of the present invention, at least one of the two through holes 14A and 14B has narrow portions 15A and 15B in which the distance between the two through holes 14A and 14B is locally increased. That is, at least one of the two through-hole interconnections 16A and 16B formed by filling or depositing conductors within the two through holes 14A and 14B has narrow portions 15A and 15B in which the separation distance between the two through-hole interconnections 16A and 16B is locally increased.

As an example, FIG. 2 shows a case where both of the two through holes 14A and 14B have the narrow portions 15A and 15B. The narrow portions 15A and 15B of the two through holes 14A and 14B are disposed at the same distance from one surface of the substrate 10. Here, the narrow portions 15A and 15B are located at the center of the substrate 10 in the thickness direction. In the example shown in FIG. 2, in the shapes of the two through holes 14A and 14B, the diameters of the through holes at the same distance from one surface of the substrate 10 are the same. That is, the cross-sectional shapes of the two through holes 14A and 14B that are parallel to one surface of the substrate 10 are the same throughout the entire thickness of the substrate. If the two through holes 14A and 14B have the same cross-sectional shape, the phases of high-frequency signals flowing through both the through-hole interconnections are less likely to shift in time, which is preferable. Specifically, assuming that a direction perpendicular to the signal transmission direction from one end of a through hole is an X axis and the above end of the through hole is the origin of the signal phase, a signal phase difference between a through hole of positive polarity and a through hole of negative polarity at X=0 is 0. On the other hand, when the narrow portions 15A and 15B are disposed at different distances from one surface of the substrate 10, the length of the signal path is different between the through hole on the positive polarity side and the through hole on the negative polarity side. For this reason, the phase difference is not 0. This causes a phase difference and thus causes waveform distortion of a skew.

In the two through-hole interconnections 16A and 16B, at least one of the two through holes 14A and 14B has the narrow portions 15A and 15B. Therefore, it is possible to achieve the same effect that the distance between the conventional straight-shaped through holes is increased. That is, in the conventional straight-shaped through-hole interconnections, assuming that the distance between the through holes to satisfy the predetermined impedance conditions is X and the distance between through-hole interconnections including narrow portions is Y, the relationship of Y<X is necessarily satisfied.

The basic principle of the present invention is that, when the distance between the through-hole interconnections 16A and 16B including the narrow portions 15A and 15B according to the embodiment of the present invention is the same as the distance between the conventional straight-shaped through-hole interconnections, the relationship of $C_0 > C_1$ is satisfied assuming that the capacitive component for the former case is $C_0$ (F) and the capacitive component for the latter case is $C_1$ (F). By narrowing the distance between the through holes 14A and 14B including the narrow portions 15A and 15B, a capacitive component corresponding to the deficit is increased. As a result, it is possible to narrow the distance between the through holes 14A and 14B.

As a result, in the present invention, it is possible to narrow the distance between the two through-hole interconnections 16A and 16B, and thus, to provide the interconnection substrate 1 with which high-density mounting can be realized.

In the related art (FIGS. 11A to 13), on the surface of the substrate 100, V-shaped pitch adjusting portions 111Ap (111A) and 111Bp (111B) for adjusting the pitches between the two parallel transmission lines 111A and 111B (112) and the two parallel through-hole interconnections 110A and 110B are formed between the two parallel transmission lines 111A and 111B (112) and the two parallel through-hole interconnections 110A and 110B. In the V-shaped pitch adjusting portion, the distance between wirings is not constant. Therefore, impedance mismatch occurs and a signal waveform is distorted. For this reason, there has been a problem in that the transmission characteristics are degraded.

However, according to the present invention (FIGS. 1 to 3), since it is possible to reduce the distance between the through-hole interconnections 16A and 16B as described above, it is not necessary to greatly change the distance between wirings in the V-shaped pitch adjusting portions 11Ap (11A) and 11Bp (11B). That is, the distance between wirings in the pitch adjusting portions 11Ap (11A) and 11Bp (11B) can be made close to the distance between the surface wirings 11A and 11B. As a result, since impedance mismatch is less likely to occur in the pitch adjusting portions 11Ap (11A) and 11Bp (11B), degradation of the transmission characteristics can be suppressed.

Figure 4A:
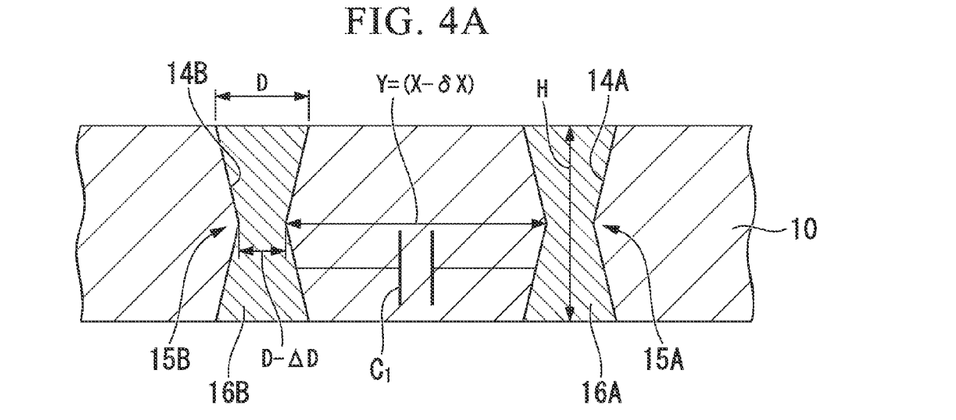
FIG. 4A is a diagram for explaining the principle of the present invention, and is a cross-sectional view showing an example of the through-hole interconnections of the interconnection substrate according to the present invention.

FIG. 4A is a diagram for explaining the principle of the present invention, and is a cross-sectional view showing parts of the through-hole interconnections 16A and 16B in the interconnection substrate 1. Assuming that the diameter of each of top and bottom surface portions of the through holes 14A and 14B of the through-hole interconnections 16A and 16B is D, the through holes 14A and 14B of the through-hole interconnections 16A and 16B have portions (narrow portions 15A and 15B) whose diameters inside the through holes 14A and 14B are reduced by $\Delta D$. That is, the diameter of each of the narrow portions 15A and 15B is $(D-\Delta D)$.

Here, the apparent inductance $L_0$ per unit length of the through-hole interconnections 16A and 16B can be expressed by the diameter D [mm] and the height H [mm] of the through-hole interconnections 16A and 16B as in Math. 5.

$$L_0 = 0.2H\left(2.303\log\frac{4H}{D} - 0.75\right)[\text{nH}] \quad [\text{Math. 5}]$$

The unit length referred to herein is defined as the thickness of the substrate 10. In addition, the apparent capacitance $C_0$ per unit length between the through-hole interconnections 16A and 16B is expressed by Math. 6 assuming that the apparent facing area is S' and the dielectric constant of the dielectric is $\in$.

$$C_0 = \varepsilon\frac{S'}{X} \quad [\text{Math. 6}]$$

However, according to the embodiment of the present invention, without changing the diameters of the top and bottom surfaces of the through-hole interconnections 16A and 16B, it is possible to increase the apparent inductance per unit length of the through-hole interconnections 16A and 16B and to reduce the apparent capacitance per unit length between the through-hole interconnections 16A and 16B by introducing the narrow portions 15A and 15B inside the through-hole interconnections 16A and 16B. That is, assuming that the apparent differential impedance is $Z_{0diff}$, the actual inductance $L_1$ is greater than $L_0$, and the actual capacitance $C_1$ per unit length is smaller than $C_0$ for Math. 7.

$$Z_{0diff} = \sqrt{\frac{L_0}{C_0}} = 100\Omega \quad [\text{Math. 7}]$$

Therefore, assuming that the actual differential impedance is $Z_{diff-dash}$, Math. 8 is greater than 100 $\Omega$.

$$Z_{diff-dash} = \sqrt{\frac{L_1}{C_1}} \quad [\text{Math. 8}]$$

In order to set the differential impedance $Z_{diff-dash}$ to 100 $\Omega$, it is necessary to reduce $Z_{diff-dash}$ somehow. When realizing this by increasing the capacitance $C_1$, this is realized by shortening the distance between the through-hole interconnections 16A and 16B by $\delta X$, as will be described later.

That is, by applying the present invention using the above-described mechanism, it is possible to shorten the distance between the through-hole interconnections 16A and 16B by $\delta X$, in other words, to miniaturize the footprint by $\delta X$, which could not be realized in the related art.

Specifically, for example, when the through-hole interconnections 16A and 16B including the narrow portions 15A and 15B are provided on the glass substrate 10, it is possible to shorten the distance up to Y=X−$\delta X$=300 μm in the present embodiment while X=350 μm in the related art. Therefore, an effect that the footprint can be reduced by $\delta X$=50 μm is obtained.

However, it is not difficult to imagine obtaining greater $\delta X$ than in the embodiment described above by making the narrow portions 15A and 15B steeper, for example.

Figure 4B:
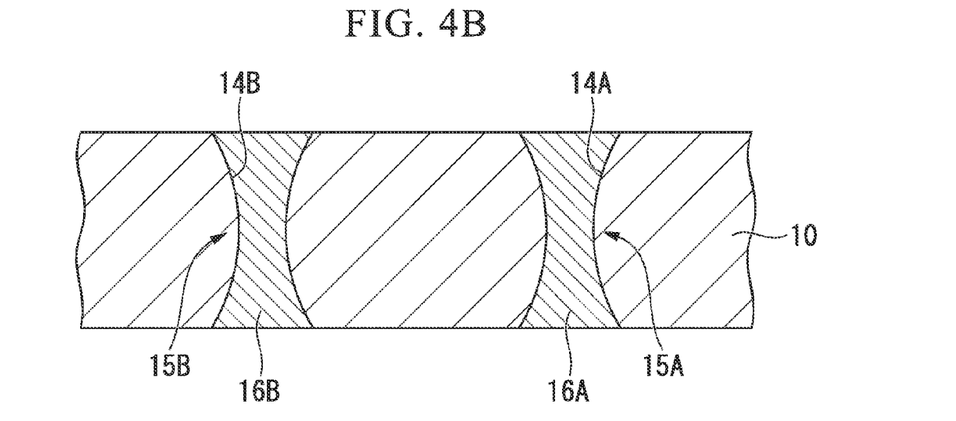
FIG. 4B is a cross-sectional view showing a modification of the through-hole interconnections of the interconnection substrate according to the present invention.
Figure 4C:
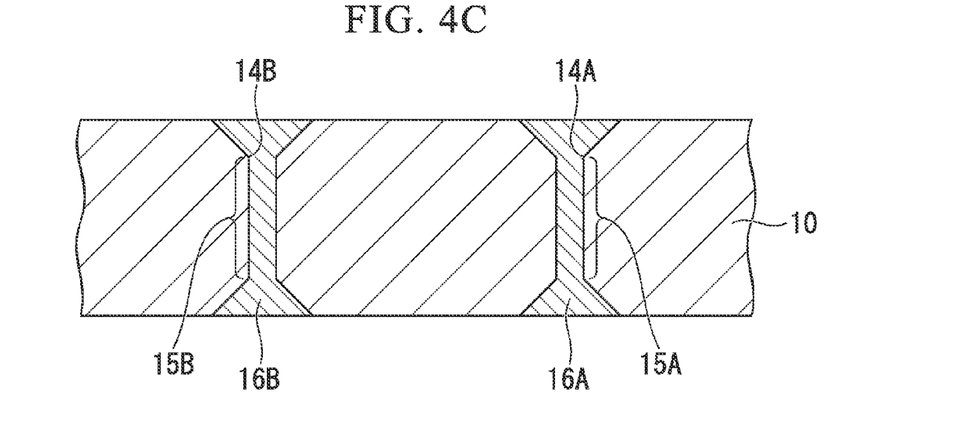
FIG. 4C is a cross-sectional view showing a modification of the through-hole interconnections of the interconnection substrate according to the present invention.

In addition, the narrow portions 15A and 15B are not limited to the shape in which the diameter of the through-hole interconnections linearly decreases toward the center of the substrate in the thickness direction as shown in FIG. 4A. For example, each narrow portion may be curved as shown in FIG. 4B. In addition, as shown in FIG. 4C, each narrow portion may be formed to have a predetermined length in the thickness direction of the substrate at a fixed diameter. In the present invention, the narrow portion refers to a region including a portion having a smaller diameter than that of through-hole interconnections in the bottom surface portion 10b and the top surface portion 10a of the substrate among the through-hole interconnections.

From the point of view of the ease of control of inductance and capacitance, it is preferable to form the narrow portions so that the diameter of the through-hole interconnections decreases continuously toward the center of the substrate in the thickness direction (or toward any other location other than the center of the substrate in the thickness direction).

The effect of the present embodiment is obtained by an increase in the apparent inductance per unit length using the narrow portions 15A and 15B of the through-hole interconnections 16A and 16B and a reduction in the apparent capacitance per unit length between the through holes 14A and 14B based on the introduction of the narrow portions 15A and 15B of the through-hole interconnections 16A and 16B.

Figure 5A:
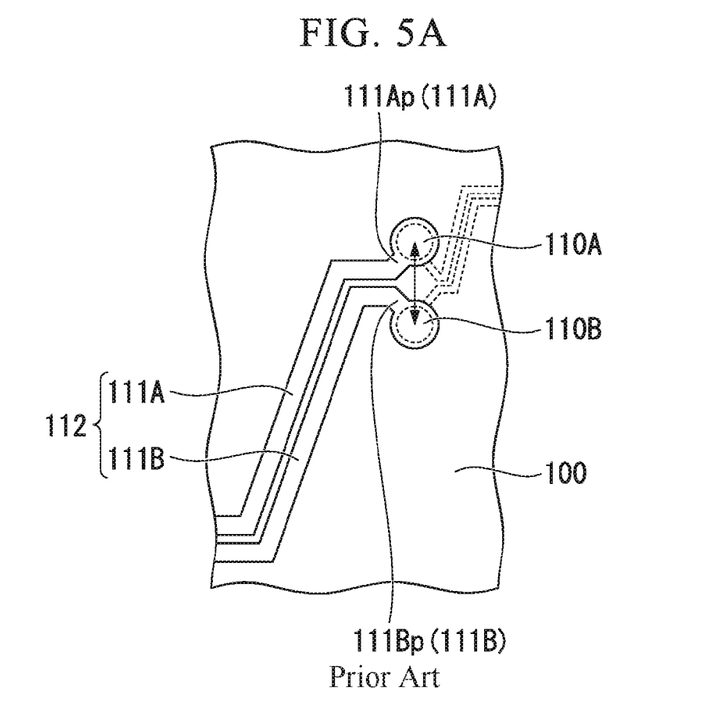
FIG. 5A is an enlarged plan view of portions of through-hole interconnections in an interconnection substrate including straight-shaped through-hole interconnections.
Figure 5B:
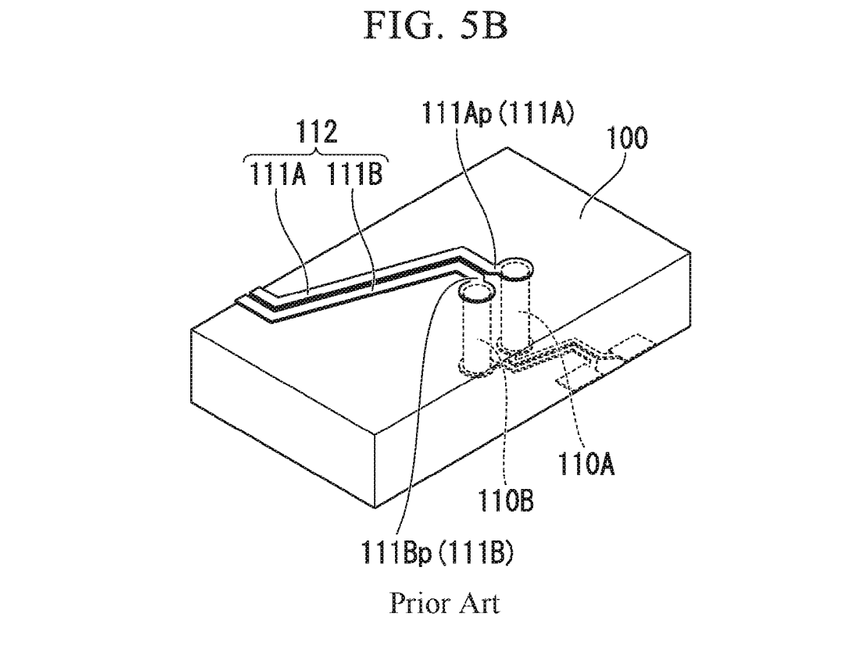
FIG. 5B is a transparent perspective view showing the interconnection substrate including straight-shaped through-hole interconnections.
Figure 6:
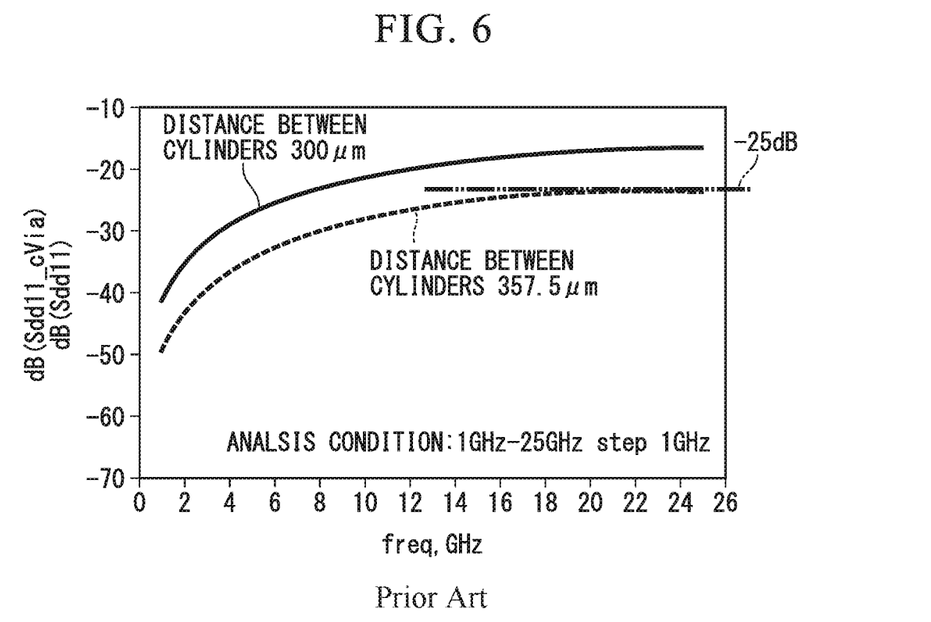
FIG. 6 is a diagram showing an electromagnetic field simulation result of the frequency characteristics of the reflection coefficient in the interconnection substrate shown in FIG. 5.

FIG. 6 shows an electromagnetic field simulation result of the frequency characteristics of the reflection coefficient for an interconnection substrate 100 including conventional straight-shaped through-hole interconnections 110A and 110B (see FIGS. 5A and 5B). "HFSS" and three-dimensional electromagnetic field analysis software by ANSYS, Inc. were used for the electromagnetic field analysis.

The impedance of a port is set to 100 $\Omega$. A transmission line (differential transmission line) connecting a through-hole interconnection and a port to each other is designed to have differential impedance=100 $\Omega$. The simulation was performed under the conditions in which the distance between the through-hole interconnections 110A and 110B was 300 and 357.5 μm. Since the reflection loss $S_{ddll}$ in the case of the 357.5 μm distance is smaller than that in the case of the 300 μm distance (that is, reflection in the case of the 357.5 μm distance is smaller than that in the case of the 300 μm distance), it can be considered that the differential impedance in the case of through-hole interconnections of 357.5 μm is close to 100 Ω. The reflection loss is less than approximately −25 dB.

Figure 7:
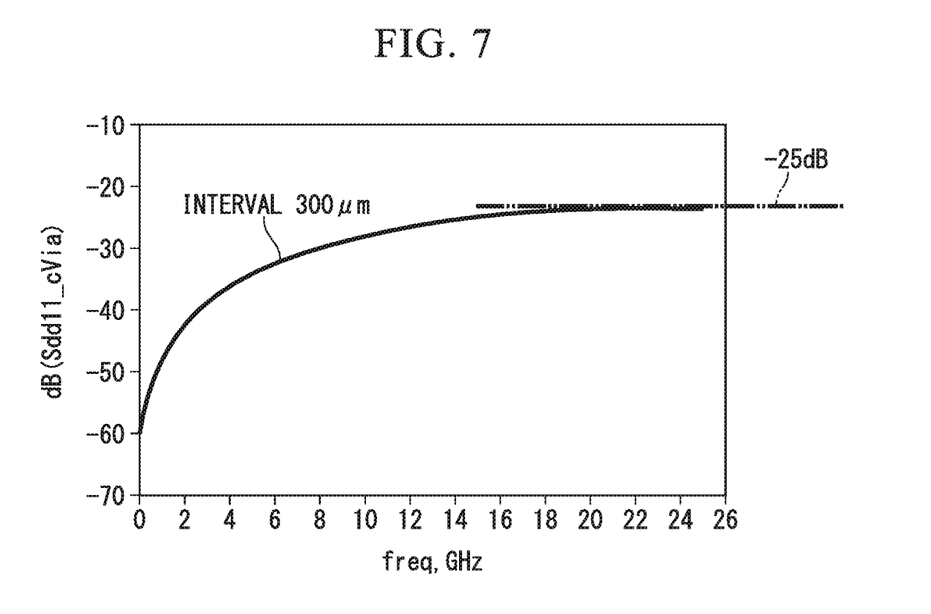
FIG. 7 is a diagram showing an electromagnetic field simulation result of the frequency characteristics of the reflection coefficient in the interconnection substrate shown in FIG. 1.

On the other hand, FIG. 7 shows a simulation result for the interconnection substrate 1 (see FIG. 1) including the through-hole interconnections 16A and 16B including the narrow portions 15A and 15B according to the embodiment of the present invention.

The distance between the through-hole interconnections 16A and 16B was 300 μm. The reflection loss was less than approximately −25 dB. Therefore, the effect in the case of the distance 357.5 μm using the straight shape can be realized with the distance 300 μm in the through-hole interconnections 16A and 16B including the narrow portions 15A and 15B according to the embodiment of the present invention.

That is, by using the through-hole interconnections according to the embodiment of the present invention, the distance between the through-hole interconnections 16A and 16B can be reduced by 57.5 μm compared with the distance between the conventional through-hole interconnections. In addition, even if the through holes 14A and 14B of the through-hole interconnections 16A and 16B are filled with metal or only the inner walls are coated, the effects of the present invention are effective.

As shown in FIG. 3, in the interconnection substrate 1 of the present embodiment, the two surface wirings 11A and 11B that form the transmission line 12 are not parallel near portions connected to the through-hole interconnections 16A and 16B. In the example shown in FIG. 2, a case is shown in which the distance between the two surface wirings 11A and 11B is large near portions connected to the through-hole interconnections 16A and 16B.

In the conventional interconnection substrate, there has been a problem in that the determined pitch between differential wirings is not fixed up to the differential through-hole interconnections and this causes impedance mismatch to influence the waveform. On the other hand, in the interconnection substrate 1 of the present embodiment, the through-hole interconnections 16A and 16B include the narrow portions 15A and 15B. Therefore, since it is possible to reduce the difference between the pitch between the two surface wirings 11A and 11B that form the transmission line 12 and the distance between the through holes 14A and 14B, it is possible to reduce the influence on the waveform due to impedance discontinuities.

Figure 8:
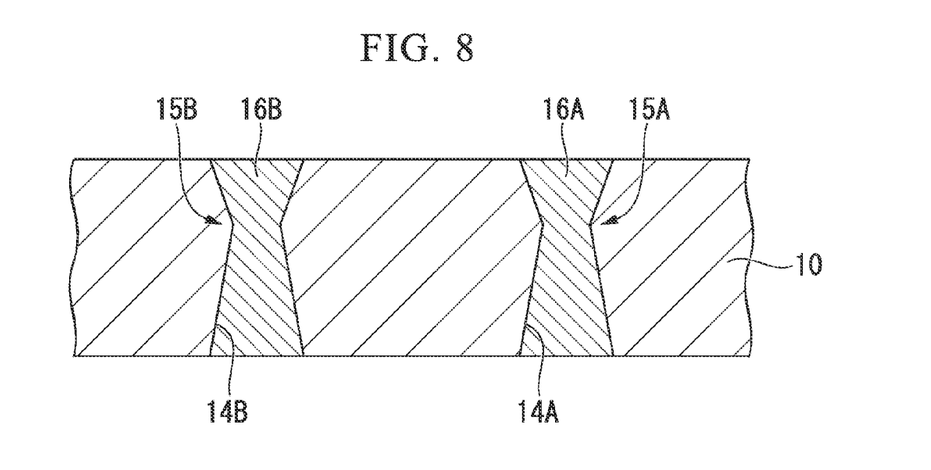
FIG. 8 is a cross-sectional view showing another example of the through-hole interconnections.

In the above explanation, an example of the case where portions having smallest diameters of the narrow portions 15A and 15B are provided at the center of the substrate 10 in the thickness direction has been given. However, the present invention is not limited to this. For example, as shown in FIG. 8, portions having smallest diameters of the narrow portions 15A and 15B may be provided anywhere other than the center in the thickness direction of the substrate 10.

When portions having smallest diameters of the narrow portions are provided at the center of the substrate in the thickness direction, it is possible to maximize the capacitance between conductors. On the other hand, when portions having smallest diameters of the narrow portions are provided in a region other than the center in the thickness direction of the substrate 10, it is possible to adjust the capacitance by shifting the thickness-direction positions of the portions having smallest diameters of the narrow portions without changing the separation distance.

Figure 9:
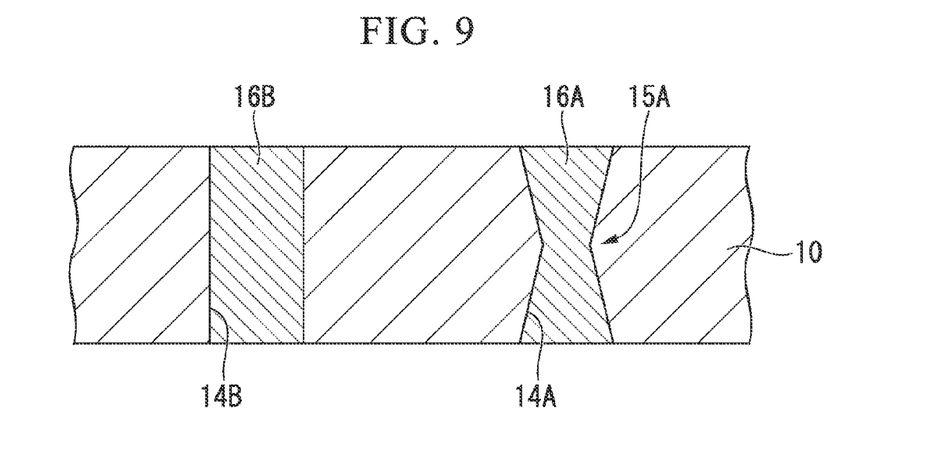
FIG. 9 is a cross-sectional view showing another example of the through-hole interconnections.

In addition, the case where both of the two through holes 14A and 14B have the narrow portions 15A and 15B has been described as an example. However, the present invention is not limited to this. For example, as shown in FIG. 9, only one (through hole 14A) of two through holes may have the narrow portion 15A.

Figure 10:
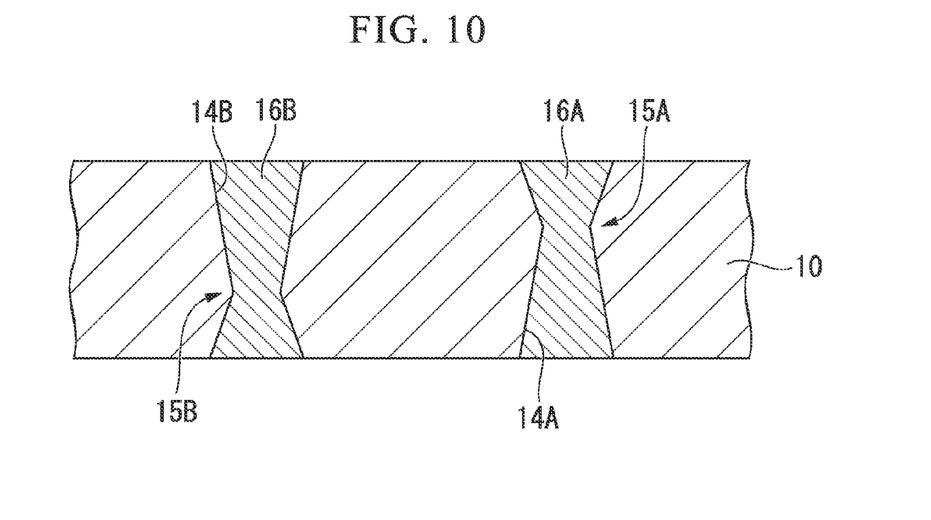
FIG. 10 is a cross-sectional view showing another example of the through-hole interconnections.

When both the two through holes 14A and 14B have the narrow portions 15A and 15B the narrow portions 15A and 15B of the two through holes 14A and 14B may be disposed at different distances from one surface of the substrate 10 as shown in FIG. 10, for example.

Such a method of forming the through holes 14A and 14B including the narrow portions 15A and 15B is not particularly limited. For example, a resist (protective film) is placed on the substrate 10 except for a portion where the through holes 14A and 14B are formed, and sandblasting is performed from both sides of the substrate 10. Finally, by peeling off the resist, the through holes 14A and 14B can be formed.

Specifically, by disposing a resist on both the one surface 10a and the other surface 10b of the substrate 10 except for a portion where the through holes 14A and 14B are formed and performing sandblasting on the substrate 10 through the resist, through holes including the narrow portions 15A and 15B having smaller diameters than that of the through-hole interconnections in one surface 10a of the substrate 10 and that of the through-hole interconnections in the other surface 10b of the substrate 10 can be formed inside the substrate.

While the interconnection substrate of the present invention has been described, the present invention is not limited to this, and various modifications can be made without departing from the scope of the invention.

The present invention can be widely applied to interconnection substrates including transmission lines.

What is claimed is:

1. An interconnection substrate, comprising:
a substrate having a first surface and a second surface opposite the first surface;
a thermal relaxation resin provided on the first surface; and
a transmission line including two parallel surface wirings formed on the thermal relaxation resin and two parallel through-hole interconnections, the two parallel through-hole interconnections being exposed to the first and second surfaces and being formed inside the substrate, and one of the two parallel through-hole interconnections being electrically connected to one of the two surface wirings and an other of the two parallel through-hole interconnections being electrically connected to an other of the two surface wirings, wherein
at least one of the two through-hole interconnections includes a narrow portion having a smaller diameter than a diameter of the through-hole interconnection in the first surface and a diameter of the through-hole interconnection in the second surface, and
the two surface wirings are connected to respective through-hole interconnections through a pitch adjusting portion configured to adjust each wiring pitch.

2. The interconnection substrate according to claim 1, wherein
each of the two through-hole interconnections has the narrow portion, and the narrow portions of the two through-hole interconnections are disposed at the same distance from the first surface.

3. The interconnection substrate according to claim 2, wherein
in the narrow portion, a portion having a smallest diameter is provided at a center of the substrate in a thickness direction of the substrate.

4. The interconnection substrate according to claim 2, wherein
shapes of the two through-hole interconnections on a cross-section parallel to the first surface are the same throughout an entire thickness of the substrate.

5. The interconnection substrate according to claim 1, wherein
the substrate is an monolithic structure.

\* \* \* \* \*